United States Patent
Schulze et al.

(10) Patent No.: US 8,055,871 B1
(45) Date of Patent: Nov. 8, 2011

(54) LOW LATENCY SYNCHRONOUS MEMORY PERFORMANCE SWITCHING USING UPDATE CONTROL

(75) Inventors: Hans Wolfgang Schulze, Sunnyvale, CA (US); Russell R. Newcomb, Morgan Hill, CA (US); Barry A. Wagner, San Jose, CA (US)

(73) Assignee: NVIDIA Corporation, Santa Clara, CA (US)

( * ) Notice: Subject to any disclaimer, the term of this patent is extended or adjusted under 35 U.S.C. 154(b) by 1259 days.

(21) Appl. No.: 11/690,013

(22) Filed: Mar. 22, 2007

Related U.S. Application Data

(60) Provisional application No. 60/891,917, filed on Feb. 27, 2007.

(51) Int. Cl.
*G06F 12/00* (2006.01)
(52) U.S. Cl. ......... 711/167; 711/105; 711/154; 711/170
(58) Field of Classification Search .................. 711/105, 711/154, 167, 170
See application file for complete search history.

(56) References Cited

U.S. PATENT DOCUMENTS

| | | | | |
|---|---|---|---|---|
| 6,151,664 | A | * | 11/2000 | Borkenhagen et al. ........ 711/150 |
| 2002/0103962 | A1 | * | 8/2002 | Toda ............................ 711/105 |
| 2004/0172148 | A1 | | 9/2004 | Horibe |
| 2006/0233036 | A1 | * | 10/2006 | Blodgett et al. ......... 365/230.01 |

OTHER PUBLICATIONS

Office Action, U.S. Appl. No. 11/690,006, dated Mar. 2, 2010.
Office Action, U.S. Appl. No. 11/690,007, dated Mar. 4, 2010.

\* cited by examiner

*Primary Examiner* — Midys Rojas
(74) *Attorney, Agent, or Firm* — Patterson & Sheridan, LLP

(57) ABSTRACT

A synchronous memory device is configured to switch into and out of a full speed mode to change speed the speed of data transactions without significantly disturbing the frequency of a clock input to a PLL or DLL that provides the internal clock for the synchronous memory device. Since the PLL or DLL receives a clock signal whether or not the synchronous memory device is in a non-full speed mode, the PLL or DLL does not need to settle or relock when the clock signal is reapplied to exit a different speed mode and return to the full speed mode. Therefore, the latency incurred to switch into and out of different speed modes is reduced by eliminating or substantially reducing the time for settling or relocking the PLL or DLL.

19 Claims, 11 Drawing Sheets

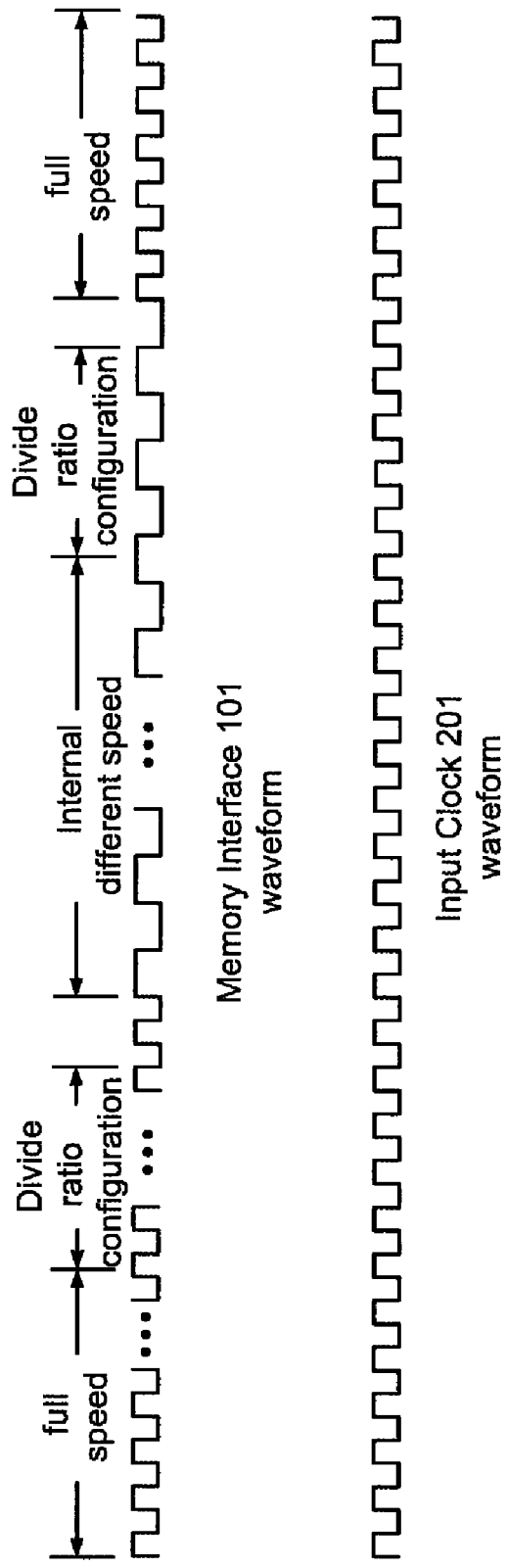

LOW LATENCY SYNCHRONOUS MEMORY PERFORMANCE SWITCHING USING UPDATE CONTROL

CROSS-REFERENCE TO RELATED APPLICATIONS

This application claims benefit of U.S. provisional patent application Ser. No. 60/891,917, filed Feb. 27, 2007, which is herein incorporated by reference.

BACKGROUND OF THE INVENTION

1. Field of the Invention

The present invention generally relates to synchronous memory devices and more specifically to reducing the latency needed to switch the speed of data transfers to and from the synchronous memory device.

2. Description of the Related Art

Conventional commercially available synchronous memory devices, such as DRAM (dynamic random access memory) or other clocked memory devices that use clocks or other signals to control the speed of their communication are at times configured to operate in a low speed mode in order to reduce the power consumed by a system including the synchronous memory device. The low speed mode is particularly useful as the number of portable, battery-powered devices has increased. In order to change speeds, a sequence of adjustments are made to prepare the synchronous memory device circuits to change the clock signal after which time the synchronous memory device resumes functioning at a lower clock speed. During the entry sequence, a phase-locked loop (PLL) or delay locked loop (DLL) that provides the internal clock signal is bypassed or the DLL is shut off altogether and the input clock that has changed frequency is provided to the memory core. The input clock at the changed frequency continues to be provided to the input of the PLL or DLL, causing the PLL or DLL output to become unlocked. Exiting the low speed mode requires a complimentary sequence of steps to enable the synchronous memory device to resume functioning at full speed. The internal clock bypass is removed, so that the PLL or DLL again provides the internal clock signal to the memory core. The input clock frequency is changed to full speed and the PLL/DLL requires many microseconds to lock to the changed input clock before data transactions can resume at a new frequency.

Although the entry and exit sequences may vary from one synchronous memory device manufacturer to another, each sequence includes time delays related to the PLL/DLL locking when the input clock to the synchronous memory device changes frequency. Because these delays are long relative to data transfer cycles, systems are configured to use the low speed mode only when the synchronous memory device will be accessed at the lower speed for a significant period of time. Therefore, the low speed mode is sometimes not used, resulting in higher power consumption.

Accordingly, what is needed in the art is a system and method for entering and exiting the low speed mode with lower latency. Lower latency for switching the synchronous memory device speed enables the low speed mode to be used more frequently and more effectively for shorter periods of time to reduce power consumption.

SUMMARY OF THE INVENTION

A system and method for configuring synchronous memory device to switch into and out of different speed modes without significantly disturbing the frequency of the clock input to the clock circuitry, e.g., PLL or DLL, allows for low speed modes to be used more frequently and for shorter periods of time in order to reduce the power consumed by the synchronous memory device. A system and method for configuring synchronous memory device to switch into and out of different speed modes also allows for higher speed modes to be used more frequently and for shorter periods of time in order to increase performance by increasing the available bandwidth to and from the synchronous memory device. In some embodiments of the present invention, clock circuitry within the synchronous memory device receives the full speed clock signal whether or not the synchronous memory device is in a different speed mode, therefore reducing or eliminating the time that the clock circuitry needs to settle or relock when the different speed mode is exited. In other embodiments of the present invention, the clock circuitry is configured to ignore the clock signal when a different speed mode is entered so that the clock circuitry does not lock to the changed frequency. The latency incurred to switch into and out of different speed modes and full speed operations is reduced by eliminating the time for settling or relocking the clock circuitry when the synchronous memory device data transfer speed is changed. In still other embodiments of the present invention, the input clock frequency changes while the PLL or DLL remains in lock by accounting for the new input frequency and reconfiguring the PLL or DLL during the time of the different speed mode.

Various embodiments of a method of the invention for switching synchronous data transaction speeds across a memory interface between a processing device and a synchronous memory include receiving a clock at a first speed across the memory interface, locking a clock unit within the synchronous memory to produce an output clock at a full speed using a first set of clock divider values and the clock at the first speed as an input, receiving a speed change command that specifies a second speed for synchronous data transactions across the memory interface that is different than the first speed, configuring the clock unit to continue to produce the output clock at the full speed using a second set of clock divider values and the clock at the second speed as the input, and performing the synchronous data transactions across the memory interface between the processing device and the synchronous memory at the second speed while receiving the clock at the second speed.

Various embodiments of the invention include a system for switching synchronous data transaction speeds across a memory interface between a processing device and a synchronous memory. The system includes a configuration unit, a clock unit, an interface unit, and a memory core. The configuration unit is coupled to the memory interface and configured to process speed change commands for the memory interface to produce configuration information. The clock unit is coupled to the memory interface and the configuration unit and configured to receive a clock signal from the processing device and produce an output clock signal based on the clock signal and a set of clock divider values that produce a constant speed output clock signal. The interface unit is coupled to the memory interface and configured to receive data transactions from the processing device and output data transactions to the processing device using the clock signal. The memory core is coupled to the interface unit and the clock unit and configured to store data that is written to the synchronous memory and output data that is read from the synchronous memory.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 3A is a timing diagram for the memory transaction interface of FIG. 1 in accordance with one or more aspects of the present invention;

DETAILED DESCRIPTION

In the following description, numerous specific details are set forth to provide a more thorough understanding of the present invention. However, it will be apparent to one of skill in the art that the present invention may be practiced without one or more of these specific details. In other instances, well-known features have not been described in order to avoid obscuring the present invention.

A synchronous memory device is configured to switch into and out of different speed modes depending on the memory bandwidth that is needed by a processing device that is coupled to the synchronous memory device. A variety of different data transaction rates may be specified by the different speed modes to provide several different performance levels. A DLL or PLL that produces an internal clock is locked to a full speed clock frequency and an output of the PLL or DLL remains substantially locked when a different speed (other than full speed) is used. Because the PLL or DLL does not lock to the changed input clock and therefore does not need to settle or relock when the full clock speed is restored. Therefore, the latency incurred to switch clock speeds is reduced by reducing or eliminating the time for settling or relocking the PLL. Reducing this latency allows the different speed modes to be used more frequently and for shorter periods of time in order to reduce the power consumed or otherwise match the speed of the synchronous memory device with a desired performance level.

A processing device communicates with the synchronous memory device to initiate a speed change on the interface between the two devices. A command is used to change the data transfer frequency. The command may be implemented as a write to a register within the synchronous memory device or as a dedicated signal between the processing device and the synchronous memory device. The synchronous memory core operating frequency may also be reduced for additional power savings or increased for greater memory bandwidth. Other power saving mechanisms, such as reducing drive strengths of the synchronous memory interface I/Os, turning off termination, and turning off a DLL may be used in conjunction with speed changes.

System Overview

Figure 1:
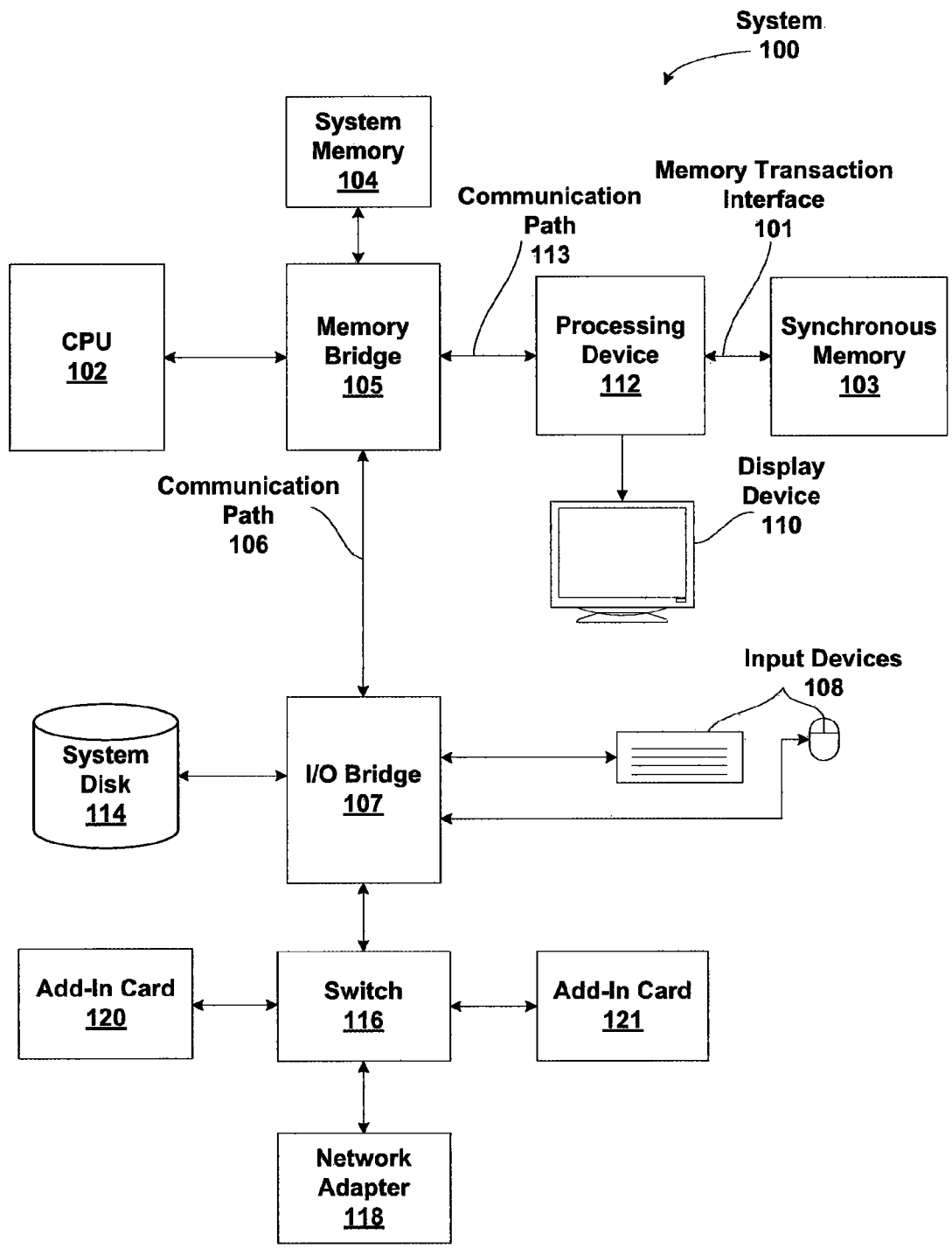
FIG. 1 is a block diagram illustrating a computer system configured to implement one or more aspects of the present invention.

FIG. 1 is a block diagram illustrating a computer system 100 configured to implement one or more aspects of the present invention. Computer system 100 includes a central processing unit (CPU) 102 and a system memory 104 communicating via a bus path that includes a memory bridge 105. Memory bridge 105, which may be, e.g., a Northbridge chip, is connected via a bus or other communication path 106 (e.g., a HyperTransport link) to an I/O (input/output) bridge 107. I/O bridge 107, which may be, e.g., a Southbridge chip, receives user input from one or more user input devices 108 (e.g., keyboard, mouse) and forwards the input to CPU 102 via path 106 and memory bridge 105. In some implementations of CPU 102, memory bridge 105 is integrated into CPU 102 and CPU 102 interfaces directly with system memory 104.

A system disk 114 is also connected to I/O bridge 107. A switch 116 provides connections between I/O bridge 107 and other components such as a network adapter 118 and various add-in cards 120 and 121. Other components (not explicitly shown), including USB or other port connections, CD drives, DVD drives, film recording devices, and the like, may also be connected to I/O bridge 107. Communication paths interconnecting the various components in FIG. 1 may be implemented using any suitable protocols, such as PCI (Peripheral Component Interconnect), PCI Express (PCI-E), AGP (Accelerated Graphics Port), HyperTransport, or any other bus or point-to-point communication protocol(s), and connections between different devices may use different protocols as is known in the art.

A processing device 112 is coupled to memory bridge 105 via a bus or other communication path 113 (e.g., a PCI Express, Accelerated Graphics Port, or HyperTransport link); in one embodiment processing device 112 is a graphics processor that delivers pixels to a display device 110 (e.g., a conventional CRT or LCD based monitor). Processing device 112 is coupled to a synchronous memory 103 via a memory transaction interface 101. In various embodiments of the present invention, processing device 112 is a graphics processor (GPU), display device, network interface controller, storage controller, system controller, north bridge, central processor (CPU), microprocessor, controller or microcontroller, or any other system or device that requires a memory circuit for intermediary or final data storage such as a DRAM, whether embodied as a collection of separate circuits, or as more integrated systems in one or more packages, as a primary or auxiliary storage area.

Processing device 112 may be configured to change the frequency of data transactions on memory transaction interface 101, as described further herein. Similarly, memory bridge 105 or CPU 102 may be configured to change the frequency of data transactions on the interface between system memory 104 and memory bridge 105 to use a different speed mode. In some embodiments of the present invention, the clock provided by processing device 112 to synchronous memory 103 is changed when a different speed mode is used. In other embodiments of the present invention, the data transaction frequency is changed while the clock remains at the full speed frequency.

Figure 2:
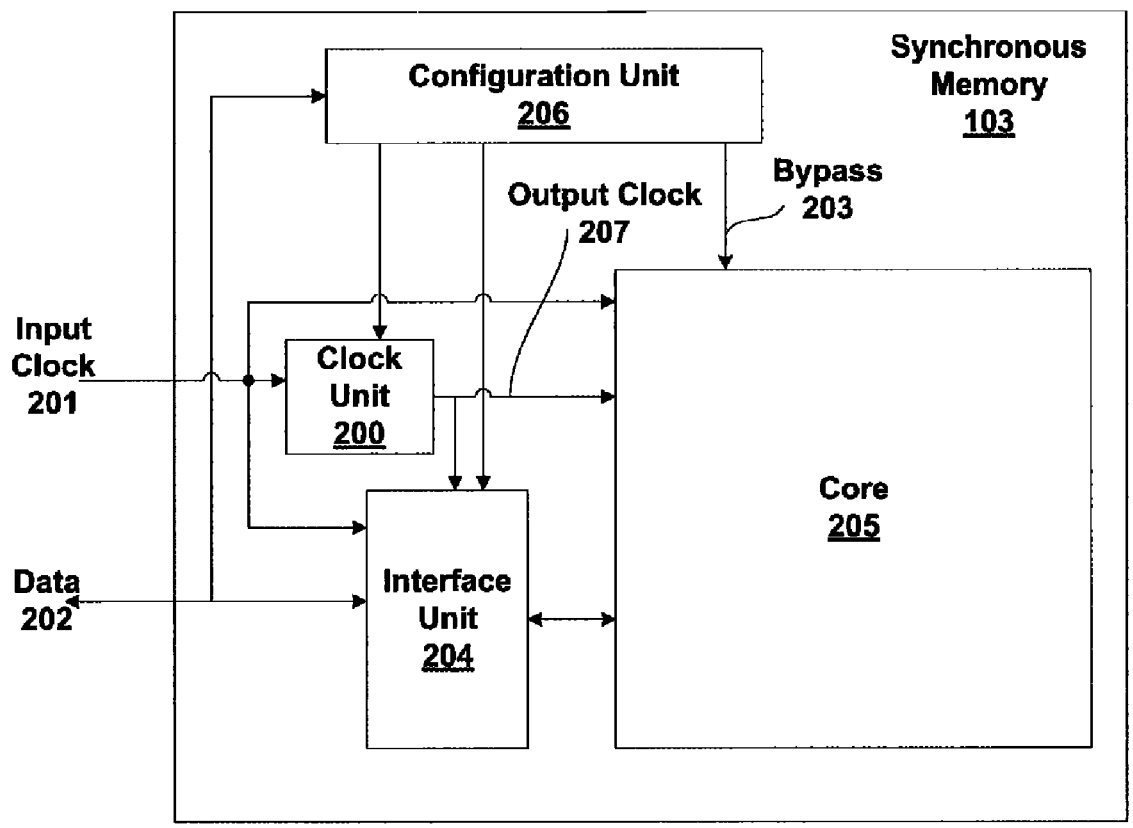
FIG. 2 is a block diagram of a synchronous memory for the computer system of FIG. 1 in accordance with one or more aspects of the present invention.

FIG. 2 is a block diagram of synchronous memory 103 or system memory 104 for the computer system 100 of FIG. 1, in accordance with one or more aspects of the present invention. Although the present invention is described in the context of synchronous memory 103 and processing device 112, the descriptions and following figures may be applied to the interface between system memory 104 and memory bridge 105 or CPU 102. Furthermore, the descriptions and following figures may be applied to other systems using synchronous memory, such as Network Interface Cards, routers, switches, data acquisition systems, personal digital assistants, hard disks, microcontrollers, disk controllers, solid state disks, and the like. Synchronous memory 103 receives input clock 201 from processing device 112. Data transactions are communicated by data 202 that includes data and address signals for writing to and reading from a core 205. Input signals of data 202 are sampled by interface unit 204 using input clock 201 and then provided to core 205. Similarly, output signals of data 202 are output to processing device 112 synchronously with input clock 201.

A speed change command is provided to synchronous memory 103 via data 202 in order to change the data transaction frequency of data 202. The command may be provided to synchronous memory device 103 by writing a register within synchronous memory device 103, using a dedicated signal between processing device 112 and synchronous memory device 103, or using other techniques known to those skilled in the art. The speed change command can be used to decrease or increase the data transaction frequency relative to the full speed frequency. The speed change command is decoded by a configuration unit 206 within synchronous memory 103 that is used to store configuration information for various operating settings, e.g., speed mode enable/disable, different speed configurations, I/O drive strength, impedance matching enable/disable, and DLL enable/disable. A clock unit 200 includes either a PLL or DLL that outputs an internal clock, output clock 207 derived from input clock 201 based on the operating settings provided by configuration unit 206. A bypass 203 output from configuration unit 206 selects either output clock 207 or input clock 201 for core 205. Core 205 may include a frequency divider to modify the selected clock.

Configuration unit 206 provides configuration settings to clock unit 200, mux 210, and interface unit 204 to enter and exit the full speed mode or different speed modes to change data transaction speeds based on commands received from processing device 112 via memory transaction interface 101. Configuration unit 206 may be used to configure interface unit 204 to select input clock 201 or output clock 207 for data transactions via data 202 and/or the interface between interface unit 204 and core 205.

In a conventional implementation of a low speed mode, the input clock is provided directly to the core and the PLL that ordinarily provided a clock to the core is bypassed when the low speed mode is enabled. Even though the PLL output is not used during the low speed mode, the slower input clock is still provided to the PLL, causing the PLL output to become unlocked. Alternatively, the PLL is turned off, eliminating the lock to the full speed frequency.

In conventional implementations of a low speed mode when a DLL is used, the DLL can be disabled instead of being bypassed. In contrast with the conventional implementation, in a first embodiment of the present invention, clock unit 200 receives input clock 201 and the data transaction speed is changed using a speed change command without changing the frequency of input clock 201. In a second embodiment of the present invention, clock unit 200 is configured to match the frequency change using internal clock dividers so that the frequency of output clock 207 remains approximately constant when the frequency of input clock 201 changes. In other embodiments of the present invention, clock unit 200 is configured to ignore input clock 201 using a speed change command, so that output clock 207 remains approximately unchanged and the latency needed to relock when the full speed frequency of input clock 201 is restored is avoided or significantly reduced.

Changing the Data Transaction Speed

Figure 3B:
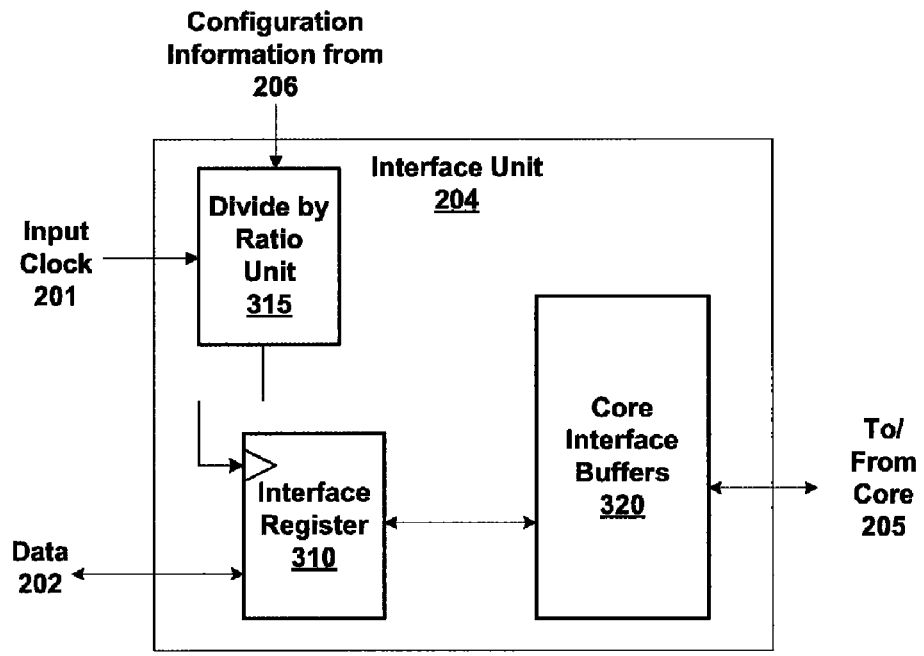
FIG. 3B is a block diagram of the interface unit of the synchronous memory of FIG. 2 in accordance with one or more aspects of the present invention.

FIG. 3A is a timing diagram for memory transaction interface 101 of FIG. 1, in accordance with one or more aspects of the present invention. Processing device 112 provides a speed change command referred to as a divide ratio command to synchronous memory 103 and configuration unit 206 adjusts the configuration settings to operate at a different internal speed that is specified by the divide ratio configuration, as described in conjunction with FIGS. 3A, 3B, 3C, and 4.

When the divide ratio command is used to change the data transaction speed, input clock 201 remains at the full speed frequency, so clock unit 200 remains locked. The memory transaction speed is changed based on a ratio specified by the divide ratio command. Interface unit 204 is configured to sample or output data 202 at a different speed that is a ratio of input clock 201 specified by the divide ratio command. Bypass 203 may be used to configure core 205 to select either output clock 207 or bypass 203 for core 205. A clock divider may be included in clock unit 200 or core 205 to change the frequency of the selected clock based on the ratio specified by the divide ratio command. Alternatively, a clock input received from a different pin than input clock 201 is provided to core 205 when the synchronous memory 103 is configured to operate at a different internal speed.

As shown in FIG. 3A, memory transaction interface 101 (shown as memory interface 101 waveform) operates at full speed for data transactions prior to receiving the divide ratio command (to simplify the explanation, full speed is the frequency that clock unit 200 is locked to and a different speed may be slower or faster than the full speed. The waveform for input clock 201 is also shown in FIG. 3A. Notice that the frequency of input clock 201 does not change when the data transaction speed changes, as shown during the internal different speed portion of memory interface 101 waveform. When the divide ratio command is received, the divide ratio configuration portion of memory interface 101 shows that processing device 112 and synchronous memory 103 are configured according to the divide ratio specified by the divide ratio command.

After the divide ratio command is executed, processing device 112 and synchronous memory 103 simultaneously resume data transactions via memory transaction interface 101 using the internal different speed. In some embodiments of the present invention, there may be a minor delay of several cycles to allow the internal circuits of core 205 and interface unit 204 to cleanly synchronize to the new speed, and to make sure that all queues and other synchronous subsystems have properly switched behavior to the new mode. Furthermore, when the divide ratios are adjusted during execution of the divide ratio command, the update for a PLL or DLL in clock unit 200 may be disabled.

As shown in FIG. 3A, when a subsequent divide ratio command is executed, the data transaction speed is changed again and processing device 112 and synchronous memory 103 simultaneously resume data transactions via memory transaction interface 101 at full speed. Alternatively, a speed other than full speed may be specified by the subsequent divide ratio command causing processing device 112 and synchronous memory 103 to simultaneously resume data transactions via memory transaction interface 101 at that speed. The latency needed to switch into and out of different speed modes and the full speed mode is minimized by providing a constant speed for input clock 201. Therefore, clock unit 200 does not need time to settle when the data transaction frequency changes, power consumption is reduced when processing device 112 and synchronous memory 103 are configured to perform lower speed data transactions and bandwidth is increased when processing device 112 and synchronous memory 103 are configured to perform higher speed data transactions.

FIG. 3B is a block diagram of interface unit 204 of synchronous memory 103 of FIG. 2, in accordance with one or more aspects of the present invention. Interface unit 204 includes a divide by ratio unit 315, an interface register 310, and core interface buffers 320. Divide by ratio unit 315 receives configuration information from configuration unit 206 that provides the divide ratio specified by the divide ratio command. When the full speed clock is used, divide by ratio unit 315 is configured to output input clock 201.

Divide by ratio unit 315 provides a divided clock to interface register 310 to sample input data received via data 202 or to synchronously output data via 202. Data is transferred between processing device 112 and interface register 310 using the clock provided by divide by ratio unit 315. Core interface buffers 320 transfers the data between interface register 310 and core 205, passing the data between two clock domains when core 205 uses a different clock than interface register 310. Core interface buffers 320 receives the clock used by core 205 with the data. Core 205 may be configured using bypass 203 to use output clock 207 or input clock 201, either of which may be divided to change the frequency within core 205 or clock unit 200.

Figure 3C:
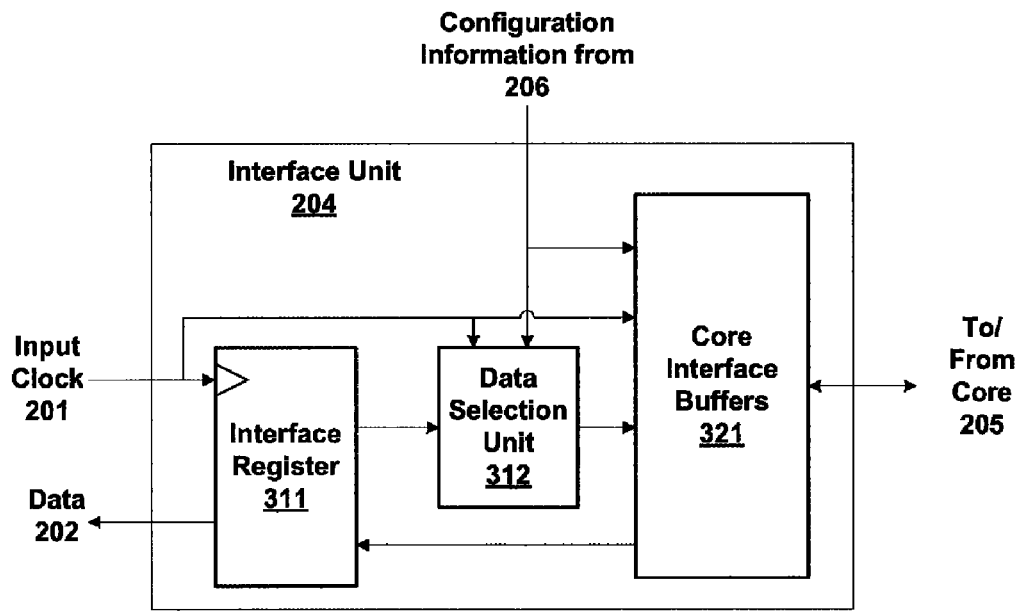
FIG. 3C is another block diagram of the interface unit of the synchronous memory of FIG. 2 in accordance with one or more aspects of the present invention.

FIG. 3C is another block diagram of interface unit 204 of synchronous memory 103 of FIG. 2, in accordance with one or more aspects of the present invention. This embodiment of interface unit 204 includes a data selection unit 312, an interface register 311, and core interface buffers 321. The divide ratio command specifies the speed of the internal clock as the product of the ratio and the speed of input clock 201, so that the internal clock is the speed of the data transactions.

Interface register 311 samples input data received via data 202 to produce registered data and synchronously outputs data to processing device 112 at the speed of the internal clock. Registered data is transferred from interface register 311 to data selection unit 312 using input clock 201. Core interface buffers 320 receives the clock used by core 205 with the data. Core 205 may be configured using bypass 203 to use output clock 207 or input clock 201, either of which may be divided to change the frequency. Output data is received by interface register 311 from core interface buffers 321 using the core clock that is passed with the output data.

Data selection unit 312 receives configuration information from configuration unit 206 that provides the divide ratio specified by the divide ratio command. When the full speed clock is used, data selection unit 312 is configured to sample the registered data received from interface register 311 using input clock 201 (on one or both edges). When a different clock is used, data selection unit 312 samples the registered data received from interface register 311 at a different speed, such as every nth edge (rising and/or falling) of input clock 201, where n is an integer specified by the divide ratio command. Data selection unit 312 provides input data to core interface buffers 321 at the different speed and receives output data from core interface buffers 321 at the different speed.

Figure 4:
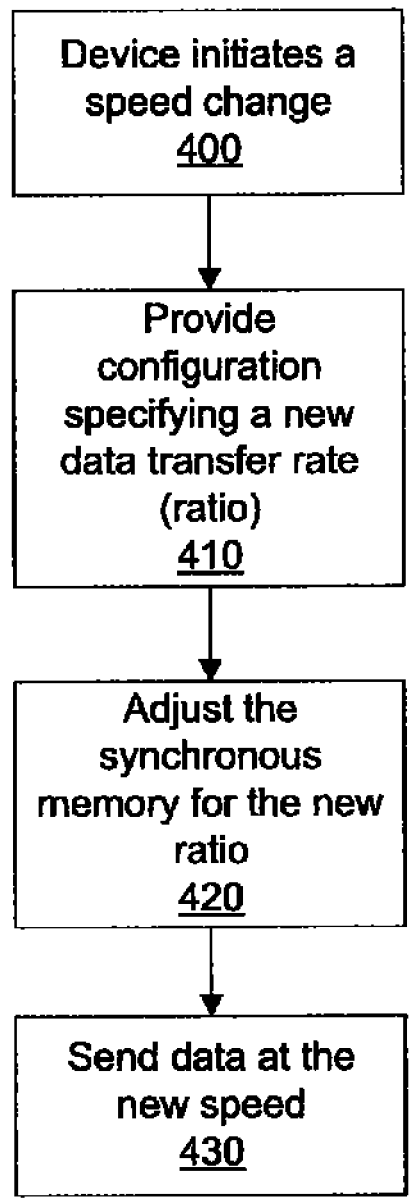
FIG. 4 is a flow diagram of method steps for changing the data transaction frequency between a processing device and a synchronous memory device in accordance with one or more aspects of the present invention.

FIG. 4 is a flow diagram of method steps for changing the data transaction frequency between processing device 112 and synchronous memory 103 to change the data transaction speed, in accordance with one or more aspects of the present invention. In step 400 processing device 112 initiates a speed change. For example, processing device 112 may increase the speed to improve performance or processing device 112 may decrease the speed to conserve battery power or meet other low power requirements. In step 410 processing device 112 provides a divide ratio configuration to synchronous memory 103 that specifies the data transaction frequency as a ratio of the frequency of input clock 201. The divide ratio command may specify one of several different speeds for the different speed mode. For example, ratios of ½, ¼, ⅛, 1/16, and other rational ratios, may be encoded as part of the divide ratio command and provided by configuration unit 206 to interface unit 204 as a different speed mode data transaction frequency. The divide ratio configuration may also specify that the full speed clock should be restored.

In step 420 synchronous memory 103 adjusts the configuration to change the data transaction frequency based on the divide ratio. Specifically, configuration unit 206 provides configuration information to interface unit 204 to divide input clock 201 when entering a different speed mode. When a subsequent divide ratio command is received that restores the full speed clock, the current different speed mode is exited, and configuration unit 206 configures interface unit 204 to use input clock 201. The ratio of input clock 201 to be used by core 205 during the different speed mode may be specified by the divide ratio command or another command. Whenever a different speed mode is used (a speed other than full speed), configuration unit 206 may configure core 205 to bypass clock 200 and use input clock 201 instead of output clock 207.

In step 430 data transactions resume at the new data transaction frequency. Importantly, the frequency of input clock 201 is not changed, only the frequency of the data transactions across memory transaction interface 101 is changed. Since input clock 201 is also maintained, clock unit 200 remains locked in order to reduce the latency incurred to change data transaction frequencies. Therefore, synchronous memory 103 can quickly enter and exit the different speed mode in order to reduce power consumption more frequently and for shorter amounts of time. Furthermore, a particular divide ratio may be specified for the different speed mode in order to reduce power consumption at a variety of data transfer speeds in order to provide different levels of memory bandwidth.

Changing Speed Using an Update Control

Figure 5A:
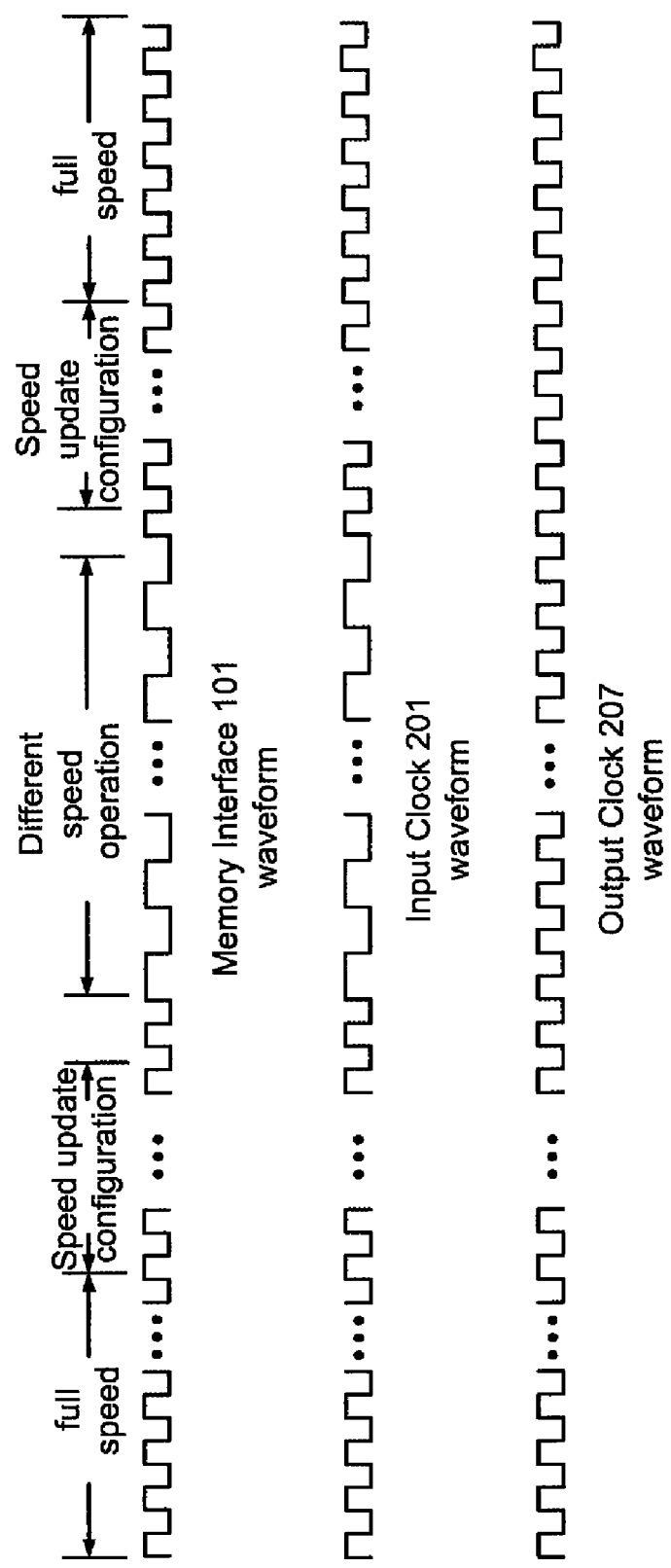
FIG. 5A is another timing diagram for the memory transaction interface of FIG. 1 in accordance with one or more aspects of the present invention.

FIG. 5A is another timing diagram for the memory transaction interface of FIG. 1, in accordance with one or more aspects of the present invention. Processing device 112 outputs a speed change command referred to as an update control speed command to synchronous memory 103. Configuration unit 206 adjusts the configuration settings to perform data transactions at a speed specified by the speed change command, as described in conjunction with FIGS. 5B and 6.

When the update control speed command is used to enter a different speed mode, input clock 201 switches to a different speed. In order to minimize any delays caused by clock unit 200 settling, settings used by clock unit 200 are adjusted, so that the frequency of output clock 207 produced by clock unit 200 remains at full speed. Bypass 203 may be used to bypass clock unit 200 and provide the different speed clock, input clock 201 to core 205, allowing the core to operate at the new desired frequency. Interface unit 204 is configured to sample data 202 using input clock 201 and synchronize outputs of data 202 to input clock 201.

As shown in FIG. 5A, memory transaction interface 101 (shown as memory interface 101 waveform) operates at full speed prior to receiving the update control speed command. After the update control speed command is executed, processing device 112 and synchronous memory 103 approximately simultaneously resume data transactions via memory transaction interface 101 in the different speed mode. The waveform for input clock 201 and output clock 207 are also shown in FIG. 5A. Notice that the frequency of input clock 201 changes and the frequency of output clock 207 does not change when the data transaction speed changes, as shown during the different speed operation portion of memory interface 101 waveform. When the update control command is received, the speed update configuration portion of the memory interface 101 waveform shows that processing device 112 and synchronous memory 103 are configured according to the rational ratio of input clock 201 that is specified by the update control command.

When a subsequent update control speed command that restores the full speed operation is executed, the different speed mode is exited and processing device 112 and synchronous memory 103 simultaneously resume data transactions via memory transaction interface 101 at full speed. Any number of intervening different speed modes may be inserted between the first full speed mode and the second full speed mode. The latency needed to switch between different speed modes and the full speed mode is minimized by providing clock unit 200 with settings that maintain a constant output clock speed for a PLL within clock unit 200. Therefore, clock unit 200 does not need substantial time to settle when the data transaction frequency changes and power consumption can be reduced or performance can be increased during the different speed modes.

Figure 5B:
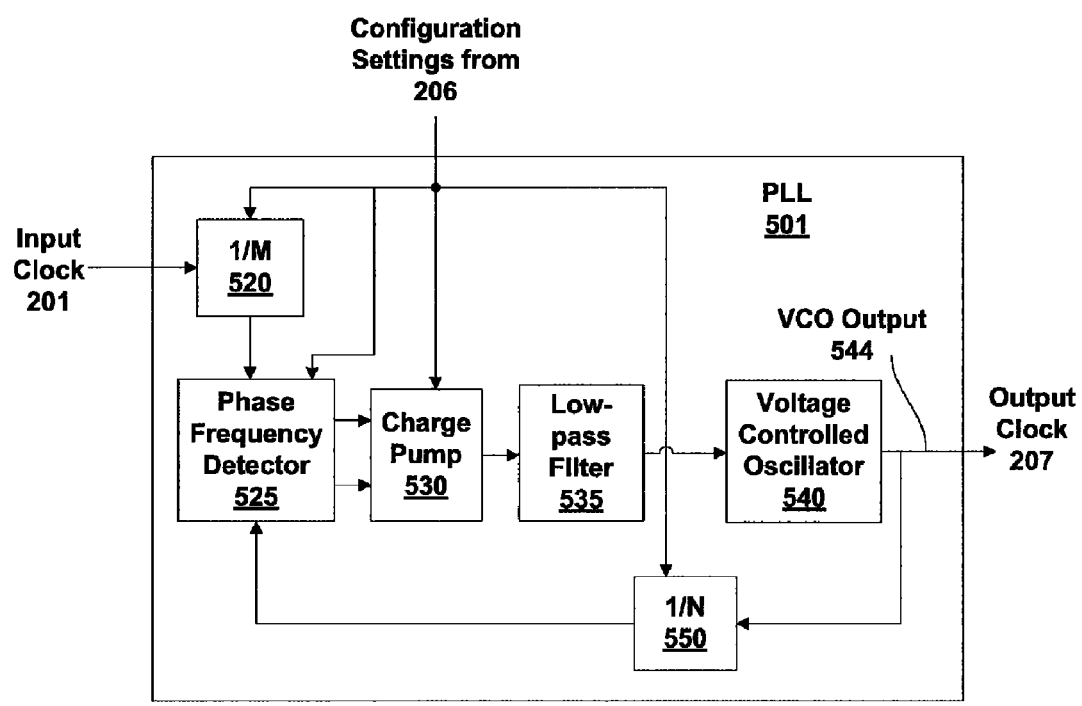
FIG. 5B is a block diagram of a PLL for the synchronous memory of FIG. 2 in accordance with one or more aspects of the present invention.

FIG. 5B is a block diagram of a PLL 501 that corresponds to clock unit 200 for synchronous memory 103 of FIG. 2, or system memory 104 of FIG. 1, in accordance with one or more aspects of the present invention. PLL 501 includes clock divider units 1/M 520 and 1/N 550, a phase frequency detector 525, a charge pump 530, a low-pass filter 535, and a voltage controlled oscillator 540. Phase frequency detector 525, low-pass filter 535, voltage controller oscillator 540, and dividers 520 and 550 are of generally conventional design and a familiar to those skilled in the art.

Configuration settings that control the operation of PLL 501 are provided by configuration unit 206. The configuration settings provide enable/disable controls for charge pump 530 and/or phase frequency detector 525 that are used to enable or disable updating of PLL 501. When the frequency of input clock 201 is changed, charge pump 530 and/or phase frequency detector 525 can be disabled so PLL 501 is not updated and VCO output 544 is minimally disrupted.

The configuration settings provide M and N values to divider units 1/M 520 and 1/N 550. M and N specify a ratio between input clock 201 and VCO output 544, where VCO output=(N/M)* input clock. A number of different combinations of input clock 201, N, and M can be used to produce the same frequency for VCO output 544. When N, M, or input clock 201 are changed to change the frequency of VCO output 544, time is needed for VCO output 544 to settle at the desired frequency. This time is the dominate component of the latency incurred when input clock 201 is changed using a conventional method to change speeds. Unlike conventional methods, the present invention advantageously maintains a relatively constant frequency for VCO output 544, in order to minimize the latency of changing speeds.

An optional clock divider 545 may be included to divide the frequency of VCO output 544 to produce output clock 207. In some embodiments of the present invention, the optional divider is used to reduce the frequency of the clock provided by clock unit 200 to core 205 instead of configuring core 205 to produce a divided input clock 201 or a divided output clock 207. A speed change command, e.g., divide ratio command, update control command, or another command, may be used to specify a clock divide value for the optional divider to modify clock output 207 (without changing VCO output 244).

Figure 6:
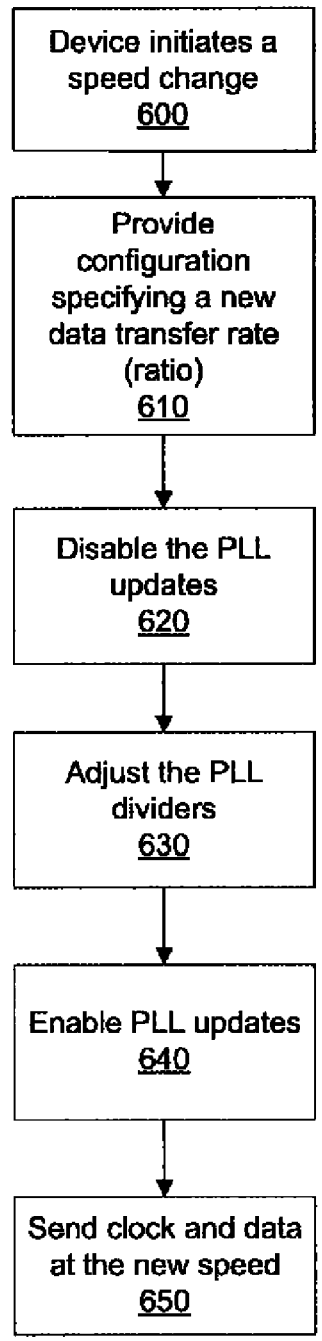
FIG. 6 is a flow diagram of method steps for changing the clock speed and data transaction frequency between a processing device and a synchronous memory device in accordance with one or more aspects of the present invention.

FIG. 6 is a flow diagram of method steps for changing the clock speed and data transaction frequency between a processing device 112 and synchronous memory 103, in accordance with one or more aspects of the present invention. In step 600 processing device 112 initiates a speed change. In step 610 processing device 112 outputs a speed change command to synchronous memory 103 (update control command) that specifies the data transaction frequency as a rational ratio of the frequency of input clock 201.

In steps 620, 630 and 640 synchronous memory 103 executes the update control speed command and adjusts the configuration of synchronous memory 103 or system memory 104 to change the data transaction frequency. Specifically, in step 620, configuration unit 206 disables updating of PLL 501 so that VCO output 544 will not substantially change while M and N are adjusted. In some embodiments of the present invention, step 620 may be performed using a separate command that is output to synchronous memory 103 or system memory 104 before the update control speed command. In step 630 configuration unit 206 provides M and N values to 1/M 500 and 1/N 550, respectively, as specified by the ratio provided by the update control speed command. In step 630 an optional divider may be configured to use a different ratio that is also specified by the update control speed command in order to change the operating frequency of core 205.

For example, in full speed mode input clock 201 has a speed of 500 MHz, N=2, M=1, producing a VCO output 544 speed of 1 GHz. If input clock 201 is slowed to a speed of 100 MHz for a low speed mode, then N is changed to 10 to maintain a VCO output 544 speed of 1 GHz, keeping clock unit 200 locked. Other values of N and M may also be used to produce maintain a VCO output 544 speed of 1 GHz, e.g., N=20 and M=10 changing to N=20 and M=2.

In step 640 configuration unit 206 enables updating of PLL 501 and the new frequency of input clock 201 is provided in order to maintain a constant frequency for VCO output 544. In some embodiments of the present invention, steps 620 and 640 are omitted. In step 650 data transactions resume at the new data transaction frequency. Importantly, the frequency of VCO output 544 remains approximately constant while the frequency of input clock 201 and of the data transactions across memory transaction interface 101 is changed. Since the N/M ratio is adjusted based on the new input clock 201, clock unit 200 remains locked the latency incurred to change data transaction frequencies is minimized. Therefore, synchronous memory 103 can quickly change data transaction and clock speeds in order to reduce power consumption or increase performance more frequently and for shorter amounts of time.

Changing Speed Using Drift Refresh

Figure 7A:
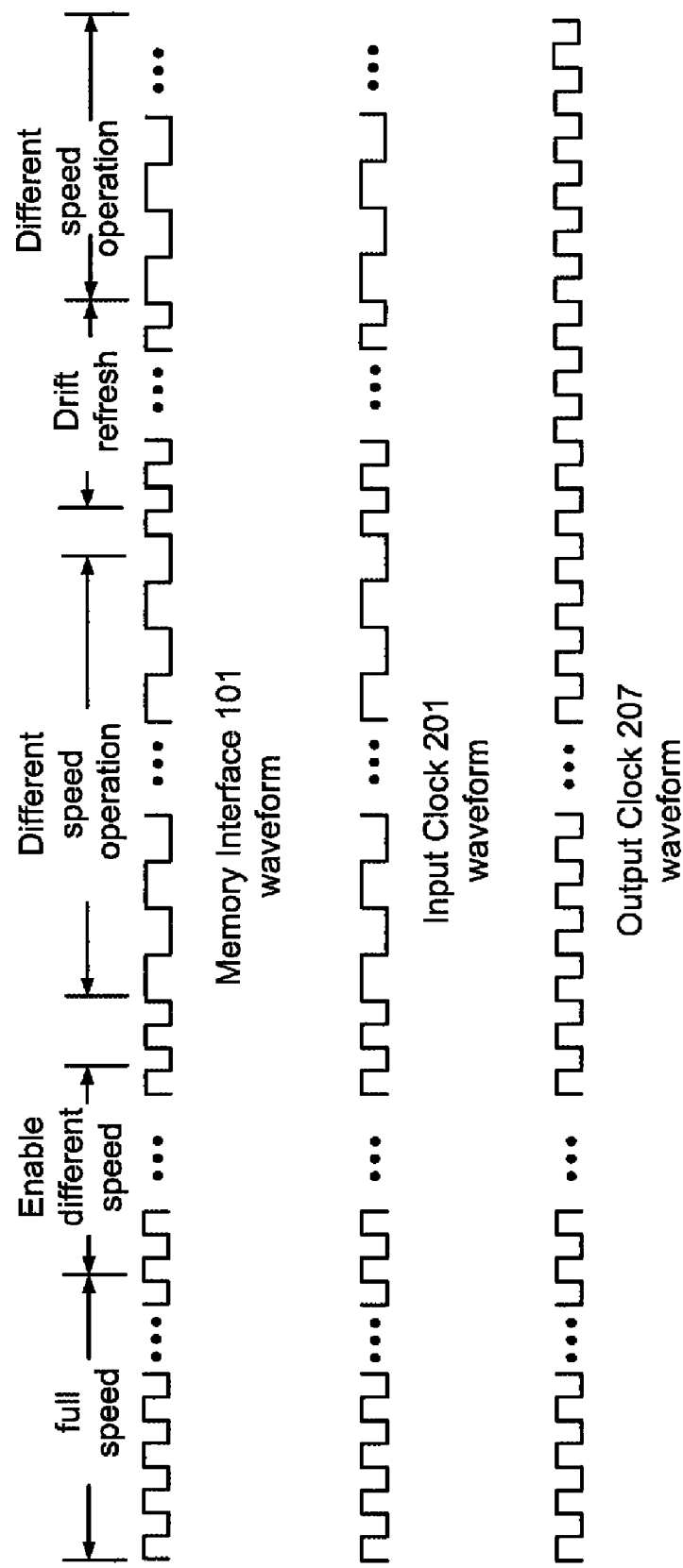
FIG. 7A is another timing diagram for the memory transaction interface of FIG. 1 in accordance with one or more aspects of the present invention.
Figure 7B:
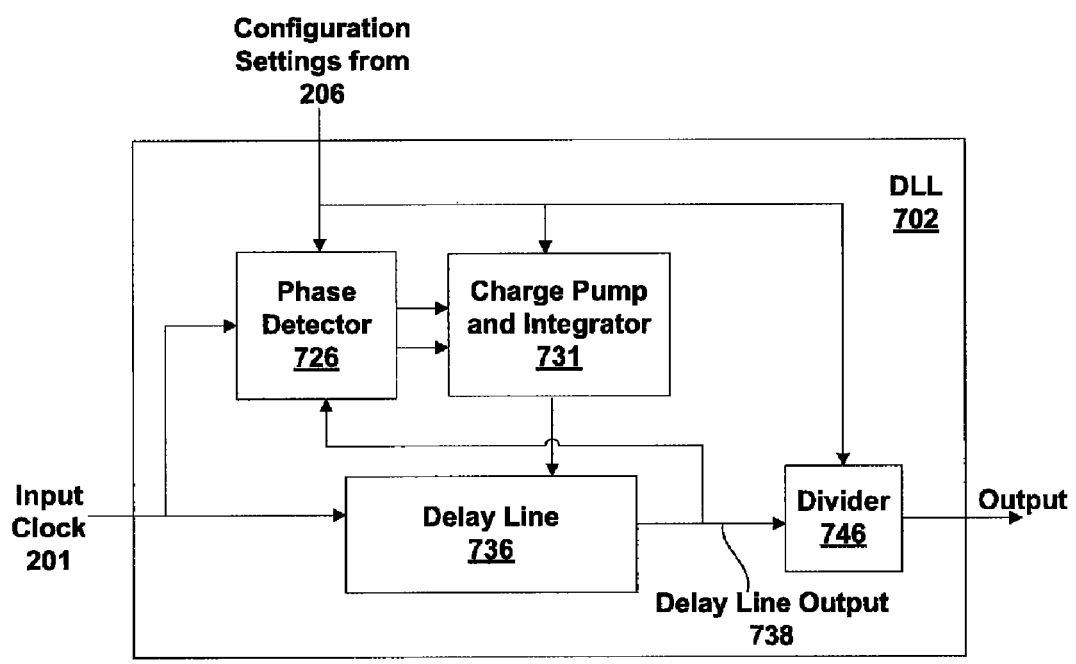
FIG. 7B is a block diagram of a DLL for the synchronous memory of FIG. 2 in accordance with one or more aspects of the present invention.

In another embodiment of the present invention, in order to minimize any delays caused by clock unit 200 settling, a charge pump 530, phase frequency detector 525, or other module that prevents the PLL 501 or a DLL from updating within clock unit 200 is disabled, and clock unit 200 is allowed to drift during the different speed mode, as described in conjunction with FIGS. 7B and 8, while clock unit 200 is bypassed using bypass 203. Interface unit 204 is configured to sample data 202 using input clock 201 and synchronize outputs of data 202 to input clock 201.

The amount of time needed to lock clock unit 200 when the different speed mode is exited and full speed is resumed increases the longer that synchronous memory 103 is in the different speed mode. Therefore, preventing PLL 501 or a DLL from updating is best used when the different speed mode will be used for a short period of time to reduce power consumption or increase performance. When the different speed mode is used for longer periods of time, charge pump 530, phase frequency detector 525, or other updating element can be enabled temporarily to allow PLL 501 to update while the full speed clock is also provided across the data transfer interface. Then the different speed mode may be resumed.

FIG. 7A is another timing diagram for memory transaction interface 101 of FIG. 1, in accordance with one or more aspects of the present invention. Processing device 112 outputs a speed change command referred to as a disable updates command to synchronous memory 103 and configuration unit 206 adjusts the configuration settings to disable updating of PLL 501 or a DLL within clock unit 200, as described in conjunction with FIGS. 7B and 8. Conversely, processing device 112 outputs a speed change command referred to as an enable updates command to synchronous memory 103 and configuration unit 206 adjusts the configuration settings to enable updating of PLL 501 or a DLL within clock unit 200. The enable and disable updates commands may also be used to perform steps 640 and 620 of FIG. 6.

As shown in FIG. 7A, memory transaction interface 101 (shown as memory interface 101 waveform) operates at full speed prior to receiving the disable updates command. After the disable updates command is executed, processing device 112 and synchronous memory 103 approximately simultaneously resume data transactions via memory transaction interface 101 in the different speed mode. The waveform for input clock 201 and output clock 207 are also shown in FIG. 7A. Notice that the frequency of input clock 201 changes and the frequency of output clock 207 does not change substantially when the data transaction speed changes, as shown during the different speed operation portion of memory interface 101 waveform.

Output clock 207 drifts until a subsequent drift refresh command is executed, as shown in the waveform for memory interface 101. In some embodiments of the present invention, the drift refresh command is initiated by synchronous memory 103. When the drift refresh command is executed by processing device 112 and synchronous memory 103, the full speed clock is temporarily provided as input clock 201 and updates of PLL 501 or a DLL are temporarily enabled to allow PLL 501 or the DLL to relock and restore the full speed clock for output clock 207. After the drift refresh command is executed, data transactions resume at the different speed. Another enable updates command may be issued to synchronously change the data transaction speed to another different speed and a enable updates command may be used to restore the full speed operation.

When a subsequent enable updates command is executed the different speed mode is exited and processing device 112 and synchronous memory 103 simultaneously resume data transactions via memory transaction interface 101 at full speed. Any number of intervening different speed modes may be inserted between the first full speed mode and the second full speed mode (when PLL/DLL updates are enabled). The latency needed to switch into, between, and out of different speed modes is minimized by configuring clock unit 200 to disable updates and allow output clock 207 to drift. Therefore, clock unit 200 does not need substantial time to settle when the data transaction frequency changes and power consumption is reduced or performance is increased during the different speed modes.

FIG. 7B is a block diagram of a DLL 702 that corresponds to clock unit 200 for synchronous memory 103 of FIG. 2, in accordance with one or more aspects of the present invention. DLL 702 includes a phase detector 726, a charge pump and integrator 731, a delay line 736, and an optional clock divider 746. Phase detector 726, delay lone 736, and divider 746 are of generally conventional design and a familiar to those skilled in the art.

Configuration settings that control the operation of DLL 702 are provided by configuration unit 206. When input clock 201 is changed to change the frequency of delay line output 738, time is needed for delay line output 738 to settle at the desired frequency. This time is the dominate component of the latency incurred when input clock 201 is changed using a conventional method to enter and exit a different speed mode. The configuration settings provide enable/disable controls for charge pump and integrator 731 and/or phase detector 726 that are used to enable or disable updating of DLL 702. When the frequency of input clock 201 is changed, charge pump and integrator 731 and/or phase detector 726 can be disabled using the disable updates command so DLL 702 is not updated and delay line output 738 is minimally disrupted. When the full speed frequency of input clock 201 is restored, charge pump and integrator 731 and/or phase detector 726 can be enabled using the enable updates command so DLL 702 is updated and the full speed clock is restored for output clock 207.

Similarly, when PLL 501 is used within clock unit 200, charge pump 530 and/or phase frequency detector 525 can be disabled using the disable updates command so PLL 501 is not updated and VCO output 544 is minimally disrupted. When the full speed frequency of input clock 201 is restored, charge pump 530 and/or phase frequency detector 525 can be enabled using the enable updates command so PLL 501 is updated and the full speed clock is restored for output clock 207. Unlike conventional methods, the present invention advantageously maintains a relatively constant frequency for delay line output 738 or VCO output 544, in order to minimize the latency of entering and exiting a different speed mode.

Optional clock divider 545 may be used to divide the frequency of VCO output 544 to produce output clock 207. In some embodiments of the present invention, divider 746 is used to reduce the frequency of the clock provided by clock unit 200 to core 205 instead of configuring core 205 to produce a divided input clock 201 or a divided output clock 207. A command, e.g., enable updates command, may be used to specify a clock divide value for divider 746 to modify clock output 207 (without changing delay line output 738).

Figures 8A, 8B:
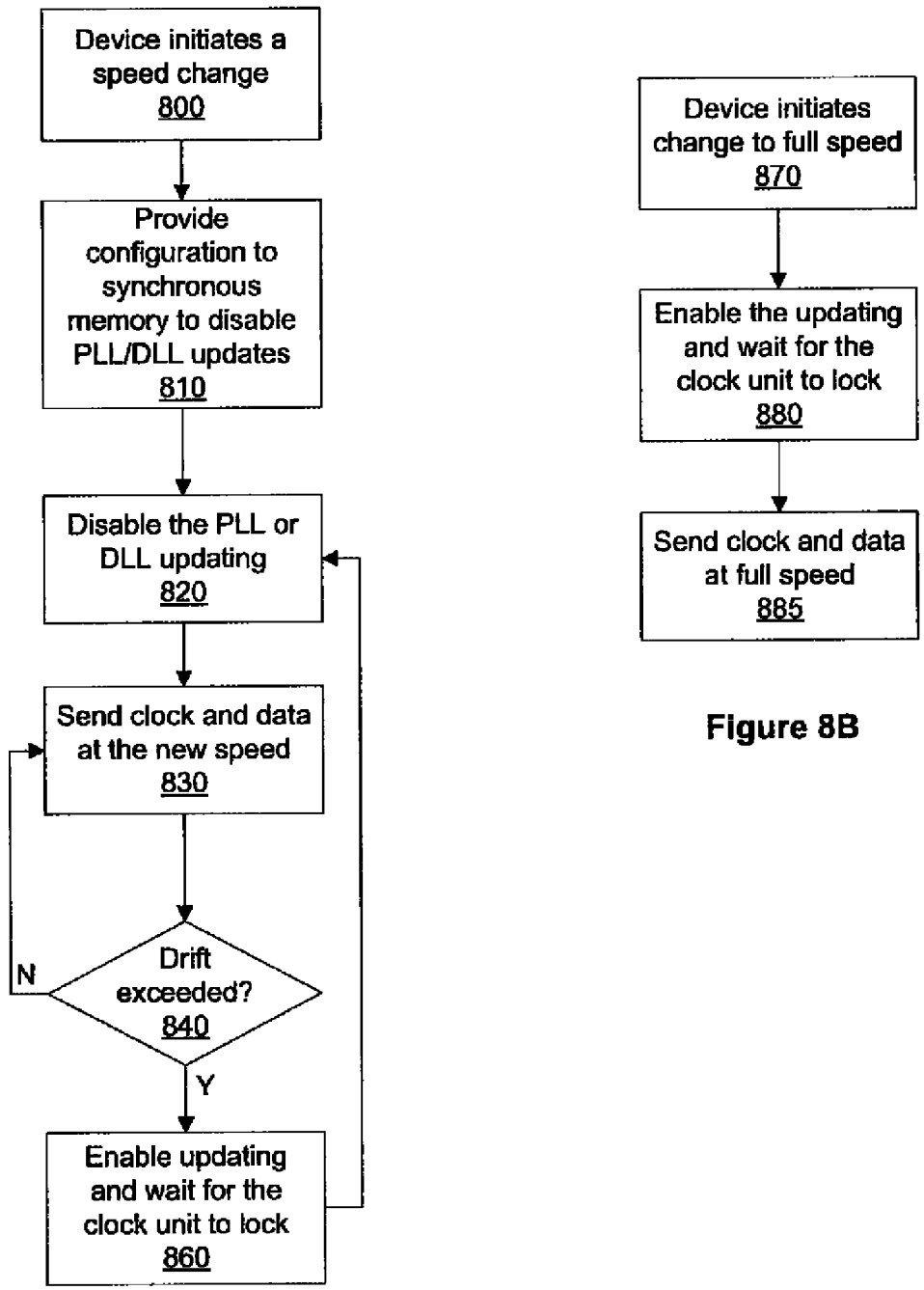
FIG. 8A is another flow diagram of method steps for changing the clock speed and data transaction frequency between a processing device and a synchronous memory device in accordance with one or more aspects of the present invention.
FIG. 8B is a flow diagram of method steps for restoring a full speed clock and data transaction frequency between a processing device and a synchronous memory device with reduced latency in accordance with one or more aspects of the present invention.

FIG. 8A is another flow diagram of method steps for changing the clock speed and data transaction frequency between a processing device 112 and synchronous memory 103, in accordance with one or more aspects of the present invention. In step 800 processing device 112 initiates a speed change. In step 810 processing device 112 outputs a disable updates command to synchronous memory 103. In step 820 configuration unit 206 disables updates to PLL 501 or DLL 702. The disable updates command does not specify the data transaction frequency as a ratio of the frequency of input clock 201, but instead disables updating of PLL 201 or DLL 702 to allow clock unit 200 to drift rather than have clock unit 200 lock to the new data transaction frequency that will be provided by input clock 201. In step 830 a different frequency is provided for input clock 201 and data transactions resume at the new data transaction frequency that is slower or faster than the full speed frequency. In some embodiment of the present invention, a single command is used to disable/enable updating of PLL 501 or DLL 702.

In step 840 configuration unit 206 determines if a drift time limit is exceeded, and if not, in step 830 data transactions continue at the new data transaction frequency. If, in step 840 configuration unit 206 determines that the drift time limit is exceeded, then in step 860 configuration unit 206 enables updating of PLL 201 or DLL 702 and waits for clock unit 200 to lock, i.e., VCO output 244 or delay line output 738 to become stable. The drift time limit may be programmable and stored by synchronous memory 103 and processing device 112, so that processing device 112 can provide the full speed clock for input clock 201 and suspend data transactions while step 860 is completed and then returns to step 820. In some embodiments of the present invention, synchronous memory 103 outputs a divided version of VCO output 244 or delay line output 738 to processing device 112, and when the drift exceeds a predetermined amount, PLL 201 or DLL 702 is updated in step 860.

FIG. 8B is a flow diagram of method steps for restoring a full speed clock and data transaction frequency between a processing device and a synchronous memory device with reduced latency in accordance with one or more aspects of the present invention. In step 870 processing device 112 initiates a speed change to restore the full speed clock and data transactions and outputs an enable updates command to synchronous memory 103. In step 880 configuration unit 206 enables updating of PLL 201 and DLL 702 and waits for clock unit 200 to lock, i.e., VCO output 244 of delay line output 738 to become stable. In step 885 the full speed clock is provided as clock input 201 and data transactions resume at the data transaction frequency for the full speed mode.

Importantly, the VCO output 244 or delay line output 738 is allowed to drift while the frequency of input clock 201 and the data transactions across memory transaction interface 101 are slowed to reduce power consumption or increased to improve performance. Therefore, synchronous memory 103 can quickly enter and exit the different speed modes in order to reduce power consumption or improve performance more frequently and for shorter amounts of time.

As previously explained, although the present invention is described in reference to memory transaction interface 101, the same systems and methods may be used to implement a speed changes on the interface between system memory 104 and memory bridge 105 or on an interface (not shown) between system memory 104 and CPU 102. Additionally, the divide ratio command, update control speed command, and enable/disable updates commands may also specify settings for the I/O drive strength, impedance matching, and the like, to reduce power consumption.

One embodiment of the invention is implemented as a program product for use with a computer system. The program(s) of the program product defines functions of the embodiments (including the methods described herein) and can be contained on a variety of computer-readable storage media. Illustrative computer-readable storage media include, but are not limited to: (i) non-writable storage media (e.g., read-only memory devices within a computer such as CD-ROM disks readable by a CD-ROM drive) on which information is permanently stored; (ii) writable storage media (e.g., floppy disks within a diskette drive or hard-disk drive) on which alterable information is stored. Such computer-readable storage media, when carrying computer-readable instructions that direct the functions of the present invention, are embodiments of the present invention.

The invention has been described above with reference to specific embodiments. Persons skilled in the art, however, will understand that various modifications and changes may be made thereto without departing from the broader spirit and scope of the invention as set forth in the appended claims. The foregoing description and drawings are, accordingly, to be regarded in an illustrative rather than a restrictive sense.

The invention claimed is:

1. A method for switching synchronous data transaction speeds across a memory interface between a processing device and a synchronous memory, comprising:
    receiving a clock at a first speed across the memory interface;
    locking a clock unit within the synchronous memory to produce an output clock at a full speed using a first set of clock divider values and the clock at the first speed as an input;
    receiving a speed change command that specifies a second speed for synchronous data transactions across the memory interface that is different than the full speed;
    configuring the clock unit to continue to produce the output clock at the full speed using a second set of clock divider values and the clock at the second speed as the input;
    allowing the output clock to drift by disabling updates to the clock unit while the clock divider values are changed from the first set of values to the second set of values; and
    performing the synchronous data transactions across the memory interface between the processing device and the synchronous memory at the second speed while receiving the clock at the second speed and maintaining the output clock at the full speed while the clock changes from the first speed to the second speed and after the clock is received at the second speed.

2. The method of claim 1, further comprising the step of enabling updates to the clock unit after the clock divider values are changed from the first set of values to the second set of values and the input clock is received at the second speed.

3. The method of claim 1, wherein the speed change command specifies the second speed as a rational ratio of the first speed.

4. The method of claim 1, further comprising the steps of:
receiving another speed change command that specifies the first speed for the synchronous data transactions across the memory interface; and
configuring the clock unit to continue to produce the output clock at the full speed using the first set of clock divider values and the clock at the first speed as the input.

5. The method of claim 1, further comprising the steps of:
receiving another speed change command that specifies a third speed for the synchronous data transactions across the memory interface that is different than the first speed and the second speed; and
configuring the clock unit to continue to produce the output clock at the full speed using a third set of clock divider values and the clock at the third speed as the input.

6. The method of claim 1, further comprising the step of configuring a memory core to bypass the output clock at the full speed and operate using the input clock at the second speed.

7. The method of claim 1, further comprising the step of configuring a clock divider within the clock unit to divide the output clock signal at the full speed to produce a clock at a different speed as an input to a memory core.

8. A computer-readable storage media containing instructions for controlling a computer system to switch synchronous data transaction speeds across a memory interface between a processing device and a synchronous memory, comprising:
receiving a clock at a first speed across the memory interface;
locking a clock unit within the synchronous memory to produce an output clock at a full speed using a first set of clock divider values and the clock at the first speed as an input;
receiving a speed change command that specifies a second speed for synchronous data transactions across the memory interface that is different than the full speed;
configuring the clock unit to continue to produce the output clock at the full speed using a second set of clock divider values and the clock at the second speed as the input;
allowing the output clock to drift by disabling updates to the clock unit while the clock divider values are changed from the first set of values to the second set of values; and
performing the synchronous data transactions across the memory interface between the processing device and the synchronous memory at the second speed while receiving the clock at the second speed and maintaining the output clock at the full speed while the clock changes from the first speed to the second speed and after the clock is received at the second speed.

9. The computer-readable storage media of claim 8, wherein the speed change command is generated to reduce power consumption of the computer system.

10. The computer-readable storage media of claim 8, wherein the speed change command is generated to increase performance of the computer system.

11. A system for switching synchronous data transaction speeds across a memory interface between a processing device and a synchronous memory, comprising:
a configuration unit coupled to the memory interface and configured to process speed change commands for the memory interface to produce configuration information;
a clock unit coupled to the memory interface and the configuration unit and configured to receive a clock signal from the processing device and produce an output clock signal based on the clock signal and a set of clock divider values that produce a constant speed output clock signal when the clock signal changes, based on the speed change commands, from a first speed to a second speed, wherein updates to the output clock signal are disabled to allow the output clock to drift while the clock divider values are changed;
an interface unit coupled to the memory interface and configured to receive data transactions from the processing device and output data transactions to the processing device using the clock signal and the output clock signal; and
a memory core coupled to the interface unit and the clock unit and configured to store data that is written to the synchronous memory and output data that is read from the synchronous memory.

12. The system of claim 11, wherein the clock unit comprises:
a first clock divider configured to scale the clock signal using a first value in the set of clock divider values to produce a divided clock signal; and
a second clock divider configured to scale the output clock signal using a second value in the set of clock divider values to produce a divided output clock signal.

13. The system of claim 12, wherein the clock unit further comprises a phase frequency detector coupled to receive the divided clock signal and the divided output clock signal and configured to update the output clock signal.

14. The system of claim 13, wherein the configuration unit is configured to disable the phase frequency detector to maintain the constant speed output clock signal while the set of clock divider values is changed.

15. The system of claim 13, wherein the clock unit further comprises a charge pump coupled to the phase frequency detector and configured to update the output clock signal.

16. The system of claim 15, wherein the configuration unit is configured to disable the charge pump to maintain the constant speed output clock signal while the set of clock divider values is changed.

17. The system of claim 12, wherein the memory core is configured to receive a bypass signal from the configuration unit that controls whether the memory core operates using the output clock signal or the clock signal from the processing device.

18. The system of claim 12, wherein the clock unit comprises a clock divider configured to divide the output clock signal to produce a clock at a different speed as an input to the memory core.

19. The system of claim 12, wherein the speed change command specifies the set of clock divider values as a rational ratio that produces the constant speed output clock signal when scaled by the clock signal.

* * * * *